US012625331B2

(12) United States Patent
Wang et al.

(10) Patent No.:  US 12,625,331 B2
(45) Date of Patent:       May 12, 2026

(54) THERMAL INTERFACE MATERIAL ASSEMBLIES

(71) Applicant: Laird Technologies (Shenzhen) Ltd., Shenzhen (CN)

(72) Inventors: Ping Wang, Shenzhen (CN); Qiuju Wu, Shenzhen (CN); Jianshan Liao, Shenzhen (CN); Jingqi Zhao, Shenzhen (CN); Weiqing Guo, Palto Alto, CA (US)

(73) Assignee: Laird Technologies (Shenzhen) Ltd., Shenzhen (CN)

( * ) Notice: Subject to any disclaimer, the term of this patent is extended or adjusted under 35 U.S.C. 154(b) by 287 days.

(21) Appl. No.: 18/125,259

(22) Filed: Mar. 23, 2023

(65) Prior Publication Data
US 2023/0314739 A1        Oct. 5, 2023

(30) Foreign Application Priority Data

Apr. 1, 2022     (CN) .......................... 202210338316.6

(51) Int. Cl.
G02B 6/42              (2006.01)
H05K 7/20              (2006.01)
H10W 40/25            (2026.01)

(52) U.S. Cl.
CPC ......... *G02B 6/4269* (2013.01); *G02B 6/4239* (2013.01); *H05K 7/20481* (2013.01); *H10W 40/25* (2026.01)

(58) Field of Classification Search
CPC .. G02B 6/4269; G02B 6/4239; G02B 6/4246; G02B 6/4261; H01L 23/373;
(Continued)

(56) References Cited

U.S. PATENT DOCUMENTS 4,322,776  A  *    3/1982   Job ................... H05K 7/20545
                                                         361/720
5,912,805  A       6/1999   Freuler et al.
(Continued)

FOREIGN PATENT DOCUMENTS

CN          217239447 U       8/2022
DE      102010029529 A1     12/2011
(Continued)

OTHER PUBLICATIONS

RTM-X Pluggable TIM; www.electronicmaterials.com; Copyright 2018; 1 page.
(Continued)

*Primary Examiner* — Scott R. Walshon
(74) *Attorney, Agent, or Firm* — Harness, Dickey & Pierce, P.L.C.; Anthony G. Fussner

(57)                 ABSTRACT

Exemplary embodiments are disclosed of thermal interface solutions for sliding surfaces. In an exemplary embodiment, a thermal interface material assembly includes a substrate having opposite first and second surfaces. An antifriction layer is along the first surface of the substrate. A thermal interface material is along the second surface of the substrate, such that the substrate is between the antifriction layer and the thermal interface material. The antifriction layer is configured to slide along in contact with a first surface of a first component when the thermal interface material assembly is along a second surface of a second component and when the first and second surfaces are slidably moved relative to each other.

34 Claims, 7 Drawing Sheets

(58) Field of Classification Search
CPC ............. H01L 23/3672; H01L 23/3735; H01L 23/3737; H01L 23/367; H01L 23/42; H05K 7/20481; H05K 1/0204; H05K 7/20454; H05K 7/20409; C09K 5/14; H01R 13/6581
See application file for complete search history.

(56) References Cited

U.S. PATENT DOCUMENTS

| | | | |
|---|---|---|---|
| 6,483,707 | B1 | 11/2002 | Freuler et al. |
| 6,956,739 | B2 | 10/2005 | Bunyan |
| 8,223,498 | B2 | 7/2012 | Lima |
| 8,345,445 | B2 | 1/2013 | Del Prete et al. |
| 8,535,787 | B1 | 9/2013 | Lima |
| 9,055,694 | B2 | 6/2015 | Lima |
| 9,420,682 | B2 | 8/2016 | Klein |
| 9,474,188 | B2 | 10/2016 | Moore et al. |
| 10,389,397 | B2 | 8/2019 | Edgren et al. |
| 10,555,439 | B2 | 2/2020 | Johnson et al. |
| 10,566,262 | B2 | 2/2020 | Zhao et al. |
| 10,567,084 | B2 | 2/2020 | Zhang et al. |
| 10,923,412 | B2 | 2/2021 | Fricker |
| 2017/0093516 | A1 | 3/2017 | Marcoccia et al. |
| 2020/0051890 | A1* | 2/2020 | Fricker ............... H01L 23/3737 |
| 2021/0134700 | A1 | 5/2021 | Fricker |
| 2021/0212241 | A1 | 7/2021 | Goli et al. |

FOREIGN PATENT DOCUMENTS

| | | | | |
|---|---|---|---|---|
| EP | 2686879 | A1 | 1/2014 | |
| JP | 6617583 | B2 | 12/2019 | |
| WO | WO-2016086410 | A1 | 6/2016 | |
| WO | WO-2016178120 | A1 | 11/2016 | |
| WO | WO-201989133 | A1 | 5/2019 | |
| WO | WO-2019237925 | A1 * | 12/2019 | .............. C09K 5/14 |
| WO | WO-2020/211930 | A1 | 10/2020 | |

OTHER PUBLICATIONS

Molykote D-96; Anti-Friction Coating; DuPont; Form No. 80-8049A-01; Copyright 2015-2019; 2 pages.

Molykote D-6600 Anti-Friction Coating; DuPont; Form 80-8322A-01; Copyright 2017-2019; 2 pages.

DuPontTM Polyimide FilmKapton EN; kapton.com; Copyright 2020; 2 pages.

Chinese invention application No. 202210338316.6 filed Apr. 2, 2022 which is the parent application to the instant application.

Taiwan Office Action and its English translation for Taiwan Divisional Application No. 114100476 that claims priority to the instant application; dated May 26, 2025, 24 pages.

* cited by examiner

106

102

THERMAL INTERFACE MATERIAL ASSEMBLIES

CROSS-REFERENCE TO RELATED APPLICATION

This application claims priority to and the benefit of Chinese Invention Patent Application No. 202210338316.6 filed Apr. 1, 2022. The disclosure of this application identified in this paragraph is incorporated herein by reference in its entirety.

FIELD

The present disclosure generally relates to thermal interface solutions for sliding surfaces.

BACKGROUND

This section provides background information related to the present disclosure which is not necessarily prior art.

Electrical components, such as semiconductors, integrated circuit packages, transistors, etc., typically have pre-designed temperatures at which the electrical components optimally operate. Ideally, the pre-designed temperatures approximate the temperature of the surrounding air. But the operation of electrical components generates heat. If the heat is not removed, the electrical components may then operate at temperatures significantly higher than their normal or desirable operating temperature. Such excessive temperatures may adversely affect the operating characteristics of the electrical components and the operation of the associated device.

To avoid or at least reduce the adverse operating characteristics from the heat generation, the heat should be removed, for example, by conducting the heat from the operating electrical component to a heatsink. The heatsink may then be cooled by conventional convection and/or radiation techniques. During conduction, the heat may pass from the operating electrical component to the heatsink either by direct surface contact between the electrical component and heatsink and/or by contact of the electrical component and heatsink surfaces through an intermediate medium or thermal interface material (TIM). The thermal interface material may be used to fill the gap between thermal transfer surfaces, in order to increase thermal transfer efficiency as compared to having the gap filled with air, which is a relatively poor thermal conductor.

SUMMARY

This section provides a general summary of the disclosure and is not a comprehensive disclosure of its full scope or all of its features.

Exemplary embodiments are disclosed of thermal interface solutions for sliding surfaces. In an exemplary embodiment, a thermal interface material assembly includes a substrate having opposite first and second surfaces. An antifriction layer is along the first surface of the substrate. A thermal interface material is along the second surface of the substrate, such that the substrate is between the antifriction layer and the thermal interface material. The antifriction layer is configured to slide along in contact with a first surface of a first component when the thermal interface material assembly is along a second surface of a second component and when the first and second surfaces are slidably moved relative to each other.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations and are not intended to limit the scope of the present disclosure.

Figure 2:
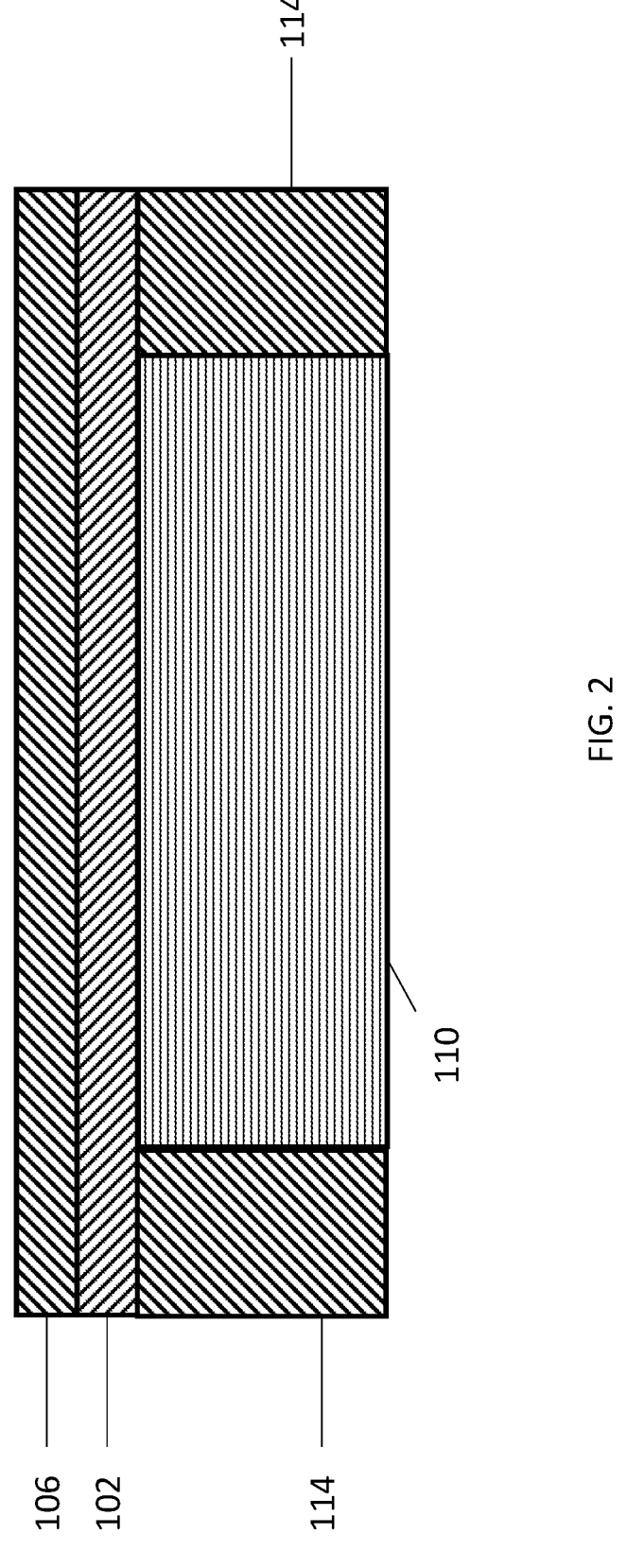
FIG. 2 is a cross-sectional view of a thermal solution or thermal interface material assembly according to an exemplary embodiment in which a thermal interface material (TIM) (e.g., thermal phase change material (PCM), etc.) and pressure sensitive adhesive (PSA) are along an opposite second side of the substrate shown in FIG. 1.
Figures 4, 5, 6:
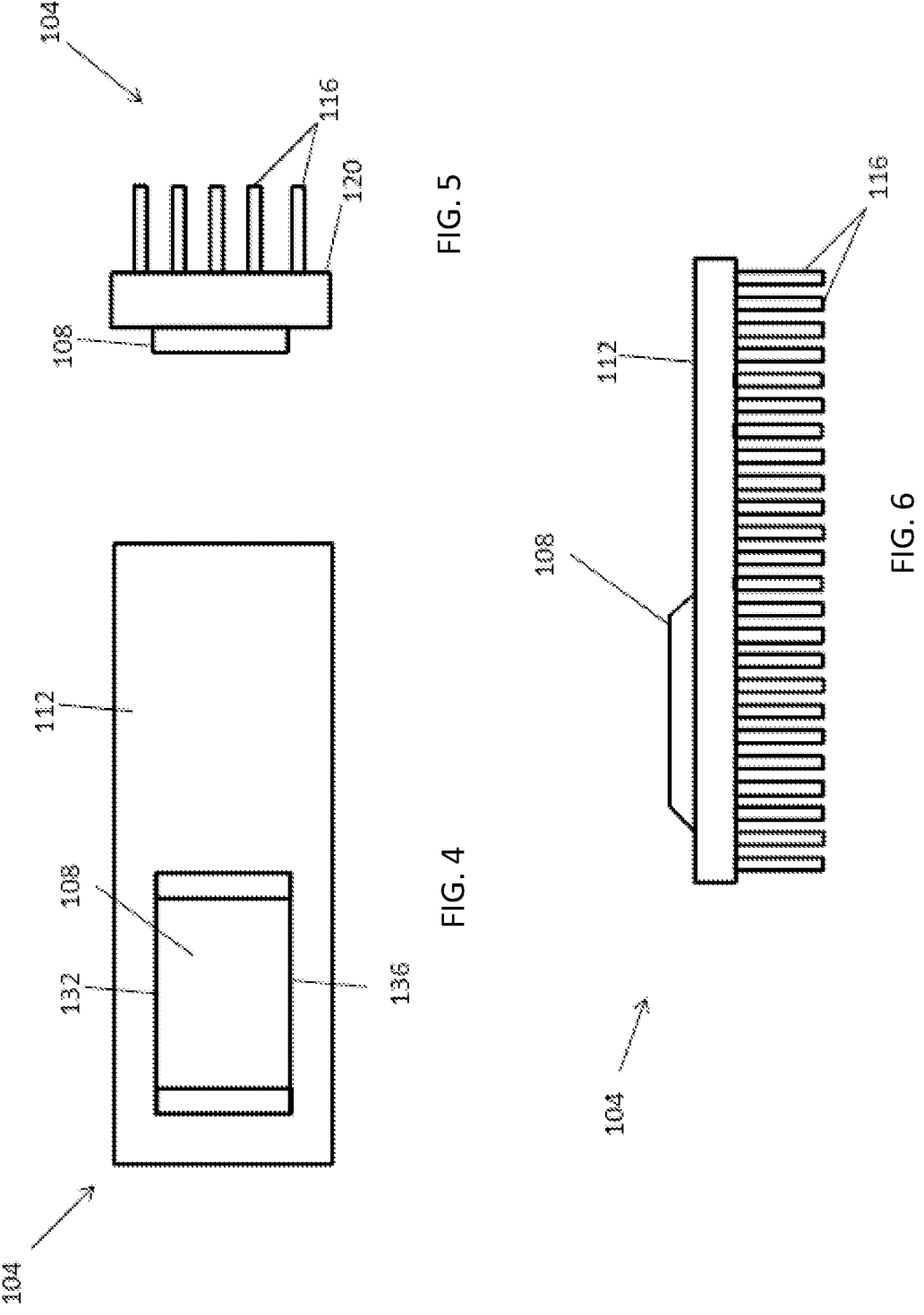

FIGS. 4, 5, and 6 illustrate an example of a heatsink including a pedestal or platform on which may be applied the thermal interface material assembly shown in FIG. 2.

Figure 7:
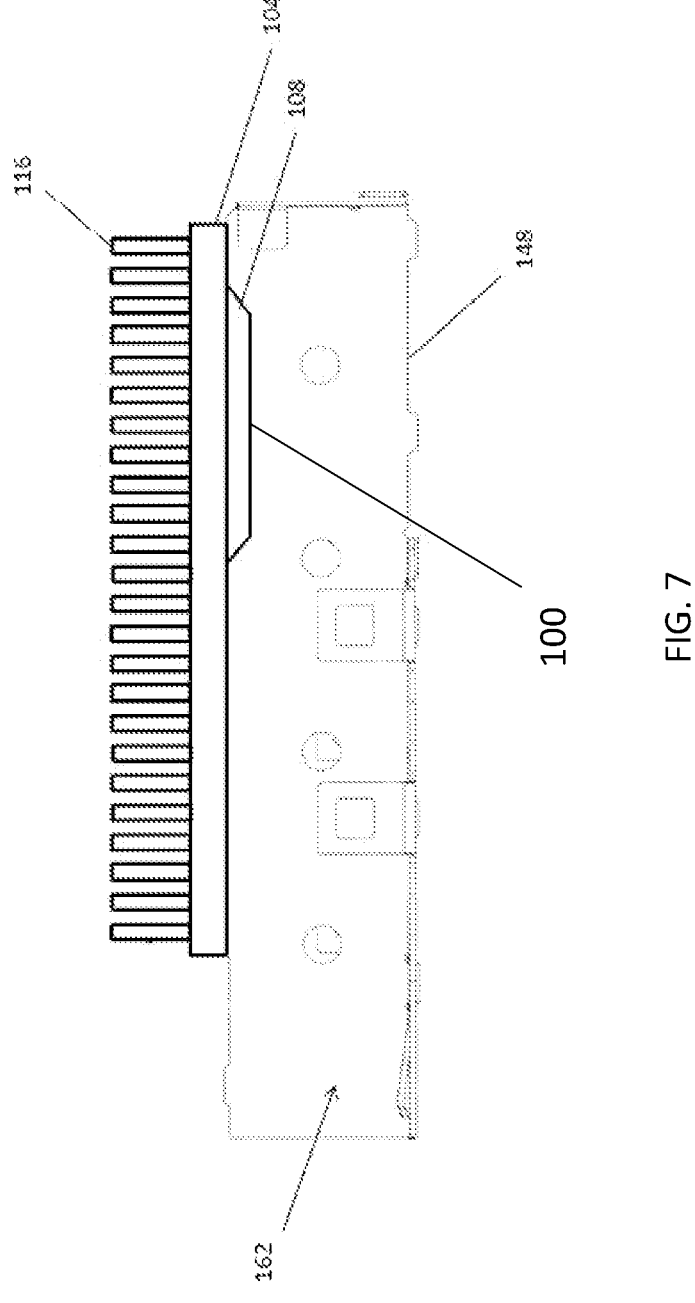

FIG. 7 illustrates the heatsink shown in FIGS. 4, 5, and 6 positioned along a top of a cage of a small form-factor pluggable (SFP) fiber optic transceiver.

Figure 8:
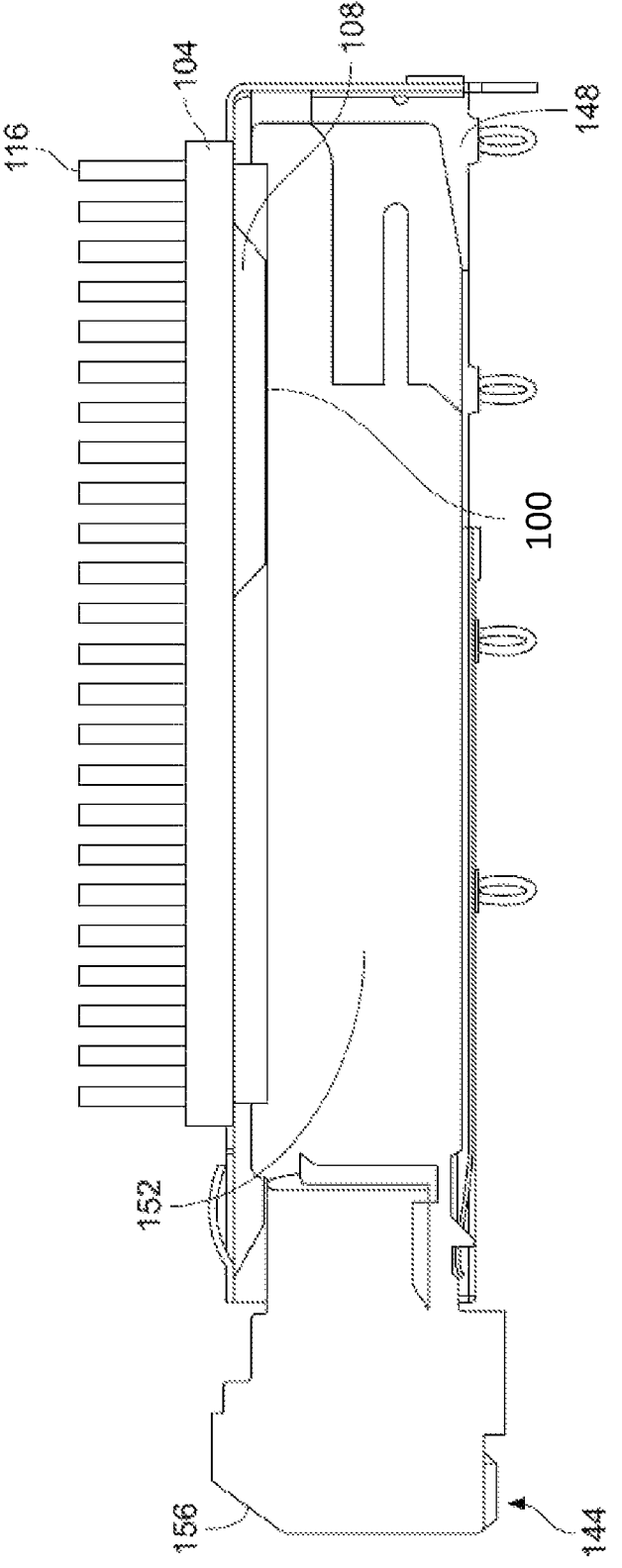

FIG. 8 illustrates the heatsink and SFP cage shown in FIG. 7, and further illustrating a connector plug within a cavity defined by the cage of the SFP transceiver.

Figure 9:
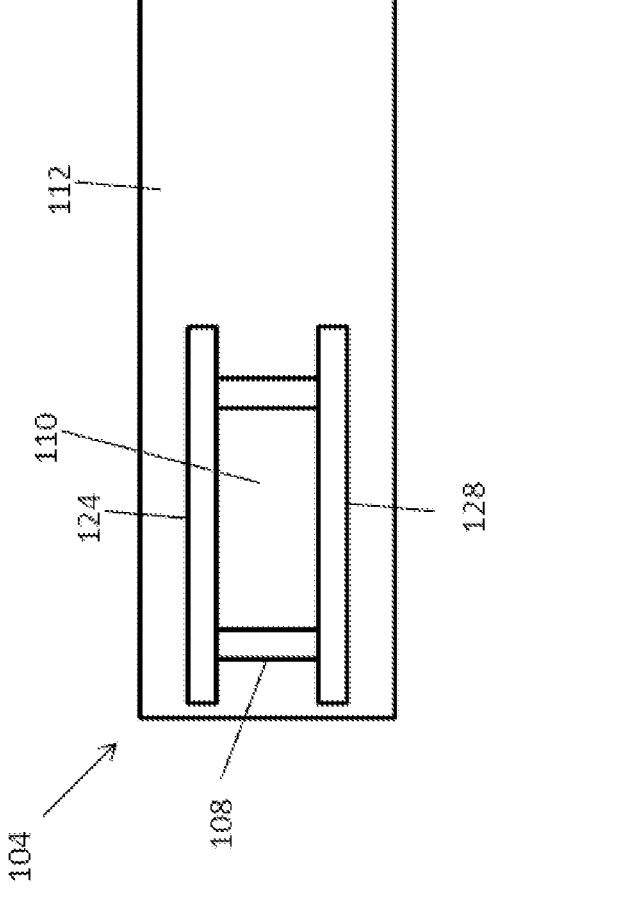

FIG. 9 illustrates the heatsink shown in FIGS. 4, 5, and 6, and also illustrating first and second strips of adhesive material (e.g., pressure sensitive adhesive, etc.) along opposing first and second edge portions of the heatsink pedestal. A thermal interface material (e.g., thermal phase change material (PCM), etc.) is along the heatsink pedestal within a channel or area defined generally between the first and second strips of adhesive material.

Corresponding reference numerals indicate corresponding parts throughout the several views of the drawings.

DETAILED DESCRIPTION

Example embodiments will now be described more fully with reference to the accompanying drawings.

As the power of optical transceivers increase with the increase of the data transfer rates, more effective heat transfer solutions are needed to avoid higher failure rate/worse reliability of the optical box modules. Thus, an interface of low thermal resistance between the optical transceiver and the heatsink is important for lowering the core temperature of the module, which interface should be able to endure multiple sliding motions, e.g., for server box maintenance purposes, etc. For example, optical modules are slidably plugged into and slidably unplugged from the cages from time to time. But conventional thermal interface materials may not have sufficient abrasion resistance to avoid damage during the repeated plugging and unplugging of the optical module. In which case, a conventional thermal interface material's thermal performance may be negatively impacted due the damage incurred from the repeated plugging and unplugging of an optical module into/from a cage.

Disclosed herein are exemplary embodiments of thermal interface solutions for sliding surfaces. In exemplary embodiments, a thermal interface material assembly includes a substrate (e.g., polymer substrate, polyimide film, a metal substrate, etc.) having opposite first and second surfaces. An antifriction layer is along the first surface of the substrate. The antifriction layer may comprise polytetrafluoroethylene (PTFE), molybdenum disulfide (MoS2), graphite, polyethylene, polypropylene, aluminum oxide, boron nitride, calcium fluoride, tungsten carbide, and/or aluminum. For example, the antifriction layer may comprise a 150MT+ polyimide film, etc.) having a thermal conductivity of about 0.8 W/m·K and thickness of about 38 microns. As another example, the substrate 102 may comprise a polyimide film that does not have any fillers, that has a thermal conductivity of about 0.15 W/m·K and a thickness within a range from about 3 microns to about 50 microns. As a further example, the substrate 102 may comprise a polyimide film (e.g., KAPTON 30EN polyimide film, etc.) without any filler and having a thickness of about 7 microns. Table 1 below sets forth properties of example substrates comprising KAPTON EN polyimide films that may be included in the thermal interface assembly 100.

TABLE 1

| Property | Unit | Direction | 20EN | 30EN | 50EN | 100EN | 200EN | Test Method |
|---|---|---|---|---|---|---|---|---|
| Thickness | μm | — | 5.0 | 7.5 | 12.5 | 25 | 50 | JIS K 7130 |
| Tensile | MPa | MD | 335 | 350 | 355 | 375 | 345 | JIS K 7161 |
| strength | | TD | 335 | 360 | 380 | 375 | 365 | |
| Elongation | % | MD | 55 | 60 | 65 | 55 | 70 | JIS K 7161 |
| | | TD | 55 | 55 | 60 | 55 | 55 | |
| Modulus | GPa | MD | 5.0 | 5.3 | 5.3 | 5.3 | 5.3 | JIS K 7161 |
| | | TD | 5.0 | 5.5 | 5.7 | 5.3 | 5.8 | |
| Heat shrinkage | % | MD | 0.01 | 0.01 | 0.01 | 0.01 | 0.01 | JIS K 7133 |
| [200° C.] | | TD | 0.01 | 0.01 | 0.01 | 0.01 | 0.01 | |
| Tear strength - | N/2 cm | MD | 51 | 75 | 135 | 235 | 475 | JIS C 2151 |
| initial | | TD | 55 | 75 | 130 | 225 | 455 | |
| CTE | ppm/° C. | MD | 16 | 16 | 16 | 15 | 17 | JIS K 7197 |
| (50-200° C.) | | TD | 16 | 14 | 14 | 15 | 13 | |
| MIT | cycles | MD | >20,000 | >20,000 | >20,000 | >20,000 | 5000 | JIS-P-8115 |
| | | TD | >20,000 | >20,000 | >20,000 | >20,000 | 5000 | |
| Surface roughness (Ra) | μm | — | 0.02~0.07 | 0.02~0.07 | 0.02~0.07 | 0.02~0.07 | 0.02~0.07 | JIS B 0601 |
| Water absorption | % | — | 1.9 | 1.6 | 1.6 | 1.6 | 1.7 | JIS K 7209 |
| Breakdown voltage | kV/mm | — | 400 | 400 | 400 | 380 | 375 | JIS C 2151 |
| Flammability | UL-94 | — | VTM-0 | VTM-0 | VTM-0 | V-0 | V-0 | UL test method | polytetrafluoroethylene (PTFE), molybdenum disulfide (MoS2), graphite, polyethylene, polypropylene, aluminum oxide, boron nitride, calcium fluoride, tungsten carbide, and/or aluminum based antifriction coating along the first surface of the substrate. A thermal interface material (e.g., a thermal phase change material (PCM), etc.) is along the second surface of the substrate, such that the substrate is between the antifriction layer and the thermal interface material. The antifriction layer is configured to slide along in contact with a first surface of a first component (e.g., a housing, a cage of a transceiver, etc.) when the thermal interface material assembly is along (e.g., adhesively attached via a pressure sensitive adhesive (PSA) to, etc.) a second surface of a second component (e.g., a heatsink, a connector plug, etc.) and when the first and second surfaces are slidably moved relative to each other.

Figure 1:
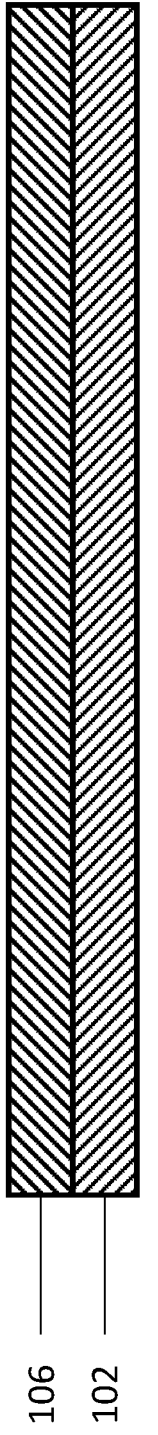
FIG. 1 is a cross-sectional view of a substrate (e.g., polyimide (PI) or other polymer substrate, a metal substrate, etc.) including an antifriction coating (e.g., polytetrafluoroethylene (PTFE) and/or molybdenum disulfide (MoS2) based anti-friction coating, etc.) along a first side of the substrate according to an exemplary embodiment of a thermal solution or thermal interface material assembly.

With reference now to the figures, FIG. 1 illustrates a substrate 102 including an antifriction layer 106 along a first or upper side of the substrate 102 according to an exemplary embodiment. The substrate 102 may comprise a polyimide (PI) substrate, other polymer substrate, a metal substrate, or other substrate disclosed herein, etc. In exemplary embodiments, the substrate 102 may comprise a polyimide film. The polyimide film may have a thermal conductivity within a range from about 0.1 Watts per meter per Kelvin (W/m·K) to about 2 W/m·K and a thickness within a range from about 3 microns (um) to about 50 microns. For example, the substrate 102 may comprise a non-metallized thermally-conductive dielectric polyimide film (e.g., KAPTON The antifriction layer 106 may comprise polytetrafluoroethylene (PTFE), molybdenum disulfide (MoS2), graphite, polyethylene, polypropylene, aluminum oxide, boron nitride, calcium fluoride, tungsten carbide, and/or aluminum. For example, the antifriction layer 106 may comprise a polytetrafluoroethylene (PTFE), molybdenum disulfide (MoS2), graphite, polyethylene, polypropylene, aluminum oxide, boron nitride, calcium fluoride, tungsten carbide, and/or aluminum based antifriction coating along the first surface of the substrate. The antifriction layer 106 preferably has a relatively low coefficient of friction. The antifriction layer 106 is preferably configured to have a lower coefficient of friction than the substrate 102. Accordingly, the antifriction layer 106 may be configured for reducing the frictional resistance that would otherwise occur between the substrate 102 and a sliding surface. By way of example, the antifriction layer 106 may have a coefficient of friction less than 0.25 based on ASTM G133 with the following testing conditions: a pin tip radius 6.35 millimeters (mm), normal force of 0.98 Newtons (N), stroke length 20 mm, oscillating frequency 0.5 Hertz (Hz), sinusoidal velocity profile, and a test duration of 16 minutes 40 seconds.

Also, by way of example, the antifriction layer may comprise a polytetrafluoroethylene (PTFE) and/or molybdenum disulfide (MoS2) based anti-friction coating (e.g., MOLYKOTE D-96 or D-6600 Anti-Friction Coating, etc.) that is applied (e.g., via spraying, dip-spinning, brushing, coating, etc.) along the first surface of the substrate such that the coating thickness is within a range from about 1 micron to about 30 microns (e.g., coating thickness of 2 microns, 3 microns, 4 microns, 5 microns, 10 microns, 15 microns, 20 microns, 25 microns, 30 microns, etc.).

Figure 3:
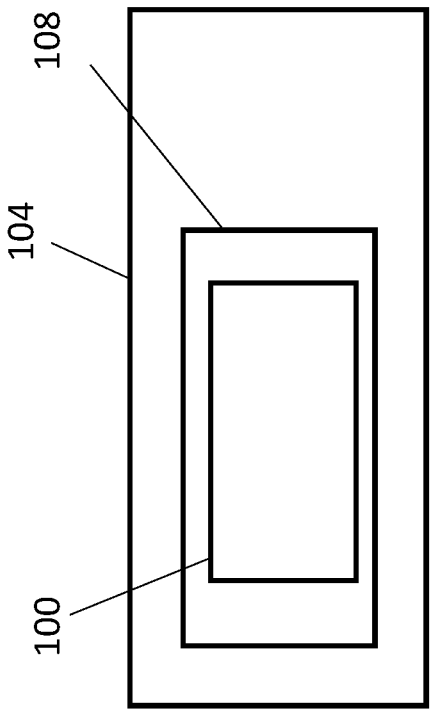
FIG. 3 illustrates an exemplary embodiment of a thermal interface material assembly applied to a pedestal or platform of an example heatsink.

FIG. 2 illustrates an exemplary embodiment of a thermal solution or thermal interface material assembly 100. As shown, a thermal interface material (TIM) 110 (e.g., thermal phase change material (PCM), etc.) and pressure sensitive adhesive (PSA) 114 are along an opposite second side of the substrate 102. The pressure sensitive adhesive 114 may be used to adhesively attach the thermal interface material assembly 100 to another component, e.g., a heatsink in direct contact with a heat source, etc. As shown in FIG. 3, the pressure sensitive adhesive 114 may be used to attach the thermal interface material assembly 100 to a pedestal or platform 108 of a heatsink 104.

A wide range of thermal interface materials may be used for the thermal interface material 110 shown in FIG. 2, such as a thermal gap filler, thermal phase change material, thermally-conductive EMI absorber or hybrid thermal/EMI absorber, thermal putty, thermal pad, thermal grease, other thermal interface materials disclosed herein, etc. In exemplary embodiments, the thermal interface material 110 comprises a thermal phase change material having a thermal conductivity of at least 3 W/m·K. For example, the thermal interface material 110 may comprise a thermal phase change material having a thermal conductivity of about 7.5 W/m·K. The thermal interface material may be naturally tacky and/or self-adherent to another surface of a component.

The pressure sensitive adhesive 114 may comprise first and second layers or coatings of pressure sensitive adhesive along opposite first and second sides of a polymer film (e.g., polyethylene terephthalate film, thermoplastic polymer film, organic heat spreader film, a flame-resistant meta-aramid film, other aramid film, etc.). For example, the pressure sensitive adhesive 114 may comprises first and second layers or coatings of pressure sensitive adhesive along opposite first and second sides of a polyethylene terephthalate film. In this latter example, the polyethylene terephthalate film may have a thickness of about 50 microns, and the pressure sensitive adhesive may have a thickness of about 25 microns along each side of the polyethylene terephthalate film.

As another example, the pressure sensitive adhesive 114 may comprise an organic heat spreader including a polymer film coated with a thermally-conductive pressure-sensitive adhesive. The organic heat spreader may be configured to have high thermal conductivity (e.g., in-plane thermal conductivity of about 50 W/m·K, etc.) within the plane of the film that is higher than the through-plane thermal conductivity (e.g., about 0.2 W/m·K, etc.), and a high resistivity (e.g., greater than 1015 Watts per centimeter (W·cm), etc.). The pressure sensitive adhesive 114 may comprise a pressure sensitive adhesive having a thickness within a range from about 80 microns to about 200 microns (e.g., 100 microns, 125 microns, 140 microns, 1:50 microns, 160 microns, etc.).

FIGS. 4, 5, and 6 illustrate an example of a heatsink 104 (broadly, heat removal/dissipation structure) including a pedestal or platform 108 (broadly, a portion). The pedestal 108 protrudes outwardly from a surface of a first side 112 of the heatsink 104. A plurality of fins 116 protrude outwardly from a second side 120 of the heatsink 104 opposite the first side 112.

By way of further example only, FIGS. 7 and 8 illustrate an exemplary embodiment in which the thermal interface material assembly 100 (FIG. 2) is used with a small form-factor pluggable (SFP) fiber optic transceiver 144 (broadly, a device or component). As shown in FIG. 8, the heatsink 104 is positioned along a top of an SFP cage 148 (broadly, a housing) with the pedestal 108 facing downwardly relative to the top of the SFP cage 148. The heatsink 104 may be coupled to the SFP cage 148 by one or more spring clips, screws, other mechanical fasteners, etc.

As shown in FIG. 8, the thermal interface material assembly 100 along the pedestal 108 thermally contacts a portion 152 of an SFP connector plug 156 (broadly, a connector) when the portion 152 of the SFP connector plug 152 is slidably inserted into the cavity 162 defined by or within the SFP cage 148.

In addition, the antifriction layer 106 (FIG. 2) of the thermal interface material assembly 100 slides along in contact with the portion 152 of the SFP connector plug 156 when the SFP connector plug 156 is slidably inserted into and slidably pulled out of the cavity 162 of the SFP cage 148. The substrate 102 (FIG. 2) of the thermal interface material assembly 100 may define a wear-resisting layer over the thermal interface material 110 and the pressure sensitive adhesive 114, such that the wear-resisting layer is between the portion 152 of the SFP connector plug 156 and the thermal interface material 110 and the pressure sensitive adhesive 114.

When the SFP connector plug 156 is slidably inserted into or slidably pulled out from the cavity 162 through the opening, the antifriction layer 106 along the substrate 102 intervenes between the portion 152 of the SFP connector plug 156 and the heatsink 104. The antifriction layer 106 along the substrate 102 thus prevents direct contact (e.g., direct sliding friction, etc.) between the thermal interface material 110 and the portion 152 of the SFP connector plug 156. This, in turn, helps to avoid decreased thermal performance of the thermal interface material 110 due to the wearing of the thermal interface material 110. When the SFP connector plug 156 is slidably inserted into the cavity 162, the antifriction layer 106 along the substrate 102 may thermally contact (e.g., make direct physical contact with, etc.) the portion 152 of the SFP connector plug 156. The thermal contact of the antifriction layer 106 with the portion 152 of the SFP connector plug 165 may reduce heat transfer resistance along the interface therebetween. With the reduced heat transfer resistance, the transfer of the heat generated by the optical module or transceiver 144 may be improved and/or good.

By way of example, the pressure sensitive adhesive (PSA) 114 may be disposed along edge portions of the thermal interface material 110 around an outer perimeter of the thermal interface material 110, such that the pressure sensitive adhesive 114 is between and adhesively attaches the substrate 102 to the heatsink pedestal 108. The pressure sensitive adhesive 114 may be configured to provide reinforcement along the edge portions of the thermal interface material 110 that are parallel and/or perpendicular to a direction in which the SFP connector plug 152 is slidably inserted and slidably removed from the cavity 162 of the SFP cage 148. The reinforcement along the edge portions of the thermal interface material 110 may absorb compression forces and help confine the thermal interface material 110 within a channel or area defined generally between portions (e.g., strips, etc.) of the pressure sensitive adhesive material 114 when the portion of the SFP connector plug 152 is slidably inserted into or removed from the cavity 162 of the SFP cage 148, thereby helping to maintain integrity of and inhibit migration of the thermal interface material 110.

In exemplary embodiments, the thermal interface material 110, the antifriction layer 106, and the PSA 114 are not slidable relative to each other. Instead, the position of the thermal interface material 110, the antifriction layer 106, and the PSA 114 relative to each other is maintained.

Continuing with the example shown in FIG. 8, the thermal interface material assembly 100 may be generally between the heatsink 104 and the connector plug 156 when the connector plug 156 is within the cage 148. The thermal interface material assembly 100 and the heatsink 104 may cooperatively define or establish at least a portion of a thermally-conductive heat path from the connector plug 156 to the fins 116 of the heatsink 104. Heat may be transferrable along this thermally-conductive heat path from the connector plug 156 to the thermal interface material assembly 100, from the thermal interface material assembly 100 to the heatsink 104, and from the heatsink fins 116 to another heat removal/dissipation structure (e.g., heat spreader, etc.) and/or to the environment. The heat transfer may reduce a temperature of the cage 148 and the connector 156, to thereby help maintain a temperature of the cage 148 and the connector 156 below a specified threshold, etc. The thermal interface material 110 and the heatsink 104 may include any suitable materials, configurations, etc. suitable to reduce the temperature of the cage 148 and connector 156. For example, the materials and configurations may be selected such that the thermal interface material 110 and the heatsink 104 are capable of dissipating heat at a rate sufficient to maintain the temperature of the cage 148 and the connector 156 below a specified threshold temperature at which operation of the connector 156 would otherwise be impaired. Transfer of heat to the thermal interface material 110 may reduce the amount of heat that is transferred from the connector 156 to another component, such as a printed circuit board (PCB) of the SFP transceiver 144, thereby reducing the amount of heat that could dissipate further from the PCB to more heat sensitive components.

The pressure sensitive adhesive 114 of the thermal interface material assembly 100 (FIG. 2) may comprise first and second strips of adhesive material 124, 128 as shown in FIG. 9. The first and second strips of adhesive material 124, 128 may be applied along (e.g., entirely and continuously along without any gaps, etc.) opposing first and second edges 132, 136 (FIG. 4) of the heatsink pedestal 108. The first and second trips of adhesive material 124, 128 may be configured to provide reinforcement along the edge portions of the thermal interface material 110 that helps to confine the thermal interface material 110 within an area defined by the first and second strips of reinforcement/adhesive material 124, 128 and thereby inhibit migration of the thermal interface material 110.

By way of example, the first and second strips of adhesive material 124, 128 may comprise polyethylene terephthalate or polyimide film including pressure sensitive adhesive along opposite first and second sides of the film. Alternatively, other materials may be used for the adhesive materials 124, 128, e.g., materials that are harder, less compliant, more durable, and/or less susceptible to abrasion than the thermal interface material 110. In addition, other exemplary embodiments may include strips of adhesive material along less than the entire length of the pedestal edges and/or in a non-continuous pattern (e.g., spaced apart strip portions with gaps therebetween, etc.) along the pedestal edges, and/or along other edges of the pedestal, etc. For example, another exemplary embodiment may include four strips of adhesive material along each of the four edges of a rectangular pedestal. Also, other exemplary embodiments may include a heatsink with a non-rectangular pedestal and/or strips of adhesive materials that are not all made of the same material.

As shown in FIG. 9, the thermal interface material 110 may be applied along the heatsink pedestal 108 within a channel or area defined generally between the first and second strips of reinforcement/adhesive material 124, 128. The substrate 102 may be disposed over the thermal interface material 110 such that antifriction layer 106 (FIG. 1) is exposed for sliding contact with the portion 152 of an SFP connector plug 156 (broadly, a connector) when the portion 152 of the SFP connector plug 156 is slidably inserted into the cavity 162 defined by or within the SFP cage 148. The first and second strips of reinforcement/adhesive material 124, 128 are between and adhesively attach the substrate 102 and the heatsink pedestal 108.

The thermal interface material assemblies disclosed herein (e.g., 100 (FIG. 2), etc.) may be used with a wide range of devices and components. Accordingly, aspects of the present disclosure are not limited to use with only heatsinks as the thermal interface material assemblies disclosed herein may be used with other heat removal/dissipation structures and/or components, e.g., a heat removal/dissipation structure that is part of a housing or cage itself, a heat pipe, a vapor chamber, a heat spreader, a cold plate, etc. The thermal interface material assemblies disclosed herein may be used with a connector plug, a slidable part of a tablet or other modular portable device, a cage of a transceiver. such as a small form-factor pluggable (SFP) transceiver, SFP+ transceiver, quad small form-factor pluggable (QSFP) transceiver, QSFP+ transceiver, XFP transceiver, etc.

By way of background, small form-factor pluggable (SFP) fiber optic transceivers are compact, hot-pluggable transceivers that may be used for telecommunications, data communications applications, etc. A SFP transceiver may interface a network device motherboard (e.g., for a switch, router, media converter, etc.) to a fiber optic or copper networking cable. SFP transceivers may support communications standards including SONET, gigabit Ethernet, Fibre Channel, etc. As used herein, small form-factor pluggable (SFP) may also include or be used in reference to other small form-factor pluggables, such as SFP+, quad (4-channel) small form-factor pluggable (QSFP), QSFP+, etc.

A conventional SFP transceiver assembly may include a pluggable module or connector plug and a receptacle assembly, which, in turn, is mounted on a printed circuit board (PCB). The pluggable module may be configured to be inserted into a front opening and cavity defined by a cage of the receptacle assembly. The pluggable module may include a housing having a portion that is held against a heatsink (e.g., at a moderate pressure, etc.) after the pluggable module is inserted into the cage. The pluggable module may subsequently be removed from the cage of the receptacle assembly. A connector plug or pluggable module may undergo numerous insertions into and removals from a cage (e.g., QSFP cage, etc.). And, the insertion/removal process may occur at elevated temperatures, such as when the junction temperature is 75 degrees Celsius (° C.) or above, etc.

The cage (e.g., cage 148 in FIG. 7, etc.) may be any suitable cage capable of receiving an SFP connector. The cage may have dimensions corresponding to an SFP connector to allow insertion of an SFP cable connector plug into the cage. The cage may receive the cable connector plug via any suitable releasably coupled engagement, including but not limited to a friction fit, a snap fit, etc. The cage may include an interface for transmitting and/or receiving signals via the SFP connector, such as an optical cable interface, an electrical cable interface, etc. The interface may allow for communication to and/or from the cable connector to a motherboard, printed circuit board (PCB), network card, etc. to which the cage is mounted.

The cage (e.g., cage 148 in FIG. 7, etc.) may comprise any suitable material, including metal, etc. For example, the cage may comprise a material suitable for shielding against noise generated by the transfer of data through the cable connector plug (e.g., electromagnetic interference (EMI) shielding, etc.). Alternative embodiments may include other devices, such as other transceivers (e.g., SFP+ transceivers, XFP transceivers, QSFP transceivers, QSFP+ transceiver, etc.), devices having housings or cages configured for use with other connectors besides SFP cable connectors, etc. Accordingly, aspects of the present disclosure should not be limited to SFP transceivers and SFP cable connectors.

A wide range of thermal interface materials may be used for the thermal interface material 110, such as a thermal gap filler, thermal phase change material, thermally-conductive EMI absorber or hybrid thermal/EMI absorber, thermal putty, thermal pad, thermal grease, etc. For example, the thermal interface material 110 preferably has a low effective thermal resistance (e.g., less than 2° C./W, less than 0.2° C./W, within a range from about 0.2° C./W to about 2° C./W, etc.). In exemplary embodiments, the thermal interface material 110 has a higher thermal conductivity than each of the substrate 102, antifriction coating 106, and reinforcement/adhesive material 114. The thermal interface material 110 may be softer, more compliant, less durable, and/or more susceptible to abrasion than the substrate 102 and reinforcement/adhesive material 114. But as disclosed herein, the thermal interface material assemblies may provide the thermal interface materials with sufficiently good durability and abrasion resistance, thereby allowing the thermal interface materials to survive and/or withstand sliding operations (e.g., repeated connector plug insertion into and/or removal from a cage of a transceiver, sliding installation of a component, etc.) including at elevated temperatures (e.g., 75° C. or above, etc.).

In some embodiments, the thermal interface material may include a silicone elastomer. The silicone elastomer may be filled with a suitable thermally-conductive material, including ceramic, boron nitride, etc. In some embodiments, the thermal interface material may comprise a graphite sheet material, a metal foil, a multi-laminate structure, such as a multi-laminate structure of metal and plastic, a multi-laminate structure of metal and graphite, or a multi-laminate structure of metal, graphite, and plastic.

The thermal interface material may comprise an elastomer and/or ceramic particles, metal particles, ferrite EMI/RFI absorbing particles, metal or fiberglass meshes in a base of rubber, gel, or wax, etc. The thermal interface material may include compliant or conformable silicone pads, non-silicone based materials (e.g., non-silicone based gap filler materials, thermoplastic and/or thermoset polymeric, elastomeric materials, etc.), silk screened materials, polyurethane foams or gels, thermally-conductive additives, etc. The thermal interface material may be configured to have sufficient conformability, compliability, and/or softness (e.g., without having to undergo a phase change or reflow, etc.) to adjust for tolerance or gaps by deflecting at low temperatures (e.g., room temperature of 20° C. to 25° C., etc.) and/or to allow the thermal interface materials to closely conform (e.g., in a relatively close fitting and encapsulating manner, etc.) to a mating surface when placed in contact with (e.g., compressed against, etc.) the mating surface, including a non-flat, curved, or uneven mating surface. By way of example only, the thermal interface material may be generally solid at a room temperature of 20° C. to 25° C. and begin to soften (though not flow freely) at temperatures above 50° C.

The thermal interface material may include a soft thermal interface material formed from elastomer and at least one thermally-conductive metal, boron nitride, and/or ceramic filler, such that the soft thermal interface material is conformable even without undergoing a phase change or reflow. In some exemplary embodiments, the thermal interface material may include ceramic filled silicone elastomer, boron nitride filled silicone elastomer, or a thermal phase change material that includes a generally non-reinforced film.

Exemplary embodiments may include one or more thermal interface materials having a high thermal conductivity (e.g., 1 W/m·K (watts per meter per Kelvin), 1.1 W/m·K, 1.2 W/m·K, 2.8 W/m·K, 3 W/m·K, 3.1 W/m·K, 3.8 W/m·K, 4 W/m·K, 4.7 W/m·K, 5 W/m·K, 5.4 W/m·K, 6 W/m·K, 7.5 W/m·K, etc.) depending on the particular materials used to make the thermal interface material and loading percentage of the thermally-conductive filler, if any. These thermal conductivities are only examples as other embodiments may include a thermal interface material with a thermal conductivity higher than 7.5 W/m·K, less than 1 W/m·K, or other values and ranges between 1 and 7.5 W/m·K. Accordingly, aspects of the present disclosure should not be limited to use with any particular thermal interface material as exemplary embodiments may include a wide range of thermal interface materials.

Exemplary embodiments disclosed herein may provide or include one or more (but not necessarily any or all) of the following advantageous effects or features. For example, thermal interface solutions disclosed herein may reduce thermal resistance between a module and a heatsink and provide a temperature decrease for higher power transceivers while also being able to withstand several hundred cycles (e.g., 500 cycles or more, etc.) of unplugging and plugging. Thermal solutions disclosed herein may lower optical module operating temperature, may be durable, and may have excellent adhesion properties and excellent surface wetting for low contact resistance. Thermal performance has been measured for thermal solutions disclosed herein (e.g., thermal interface material assembly 100 (FIG. 2), etc.), which has shown an unexpected synergistic effect of a performance improvement of at least 5° C. temperature reduction at about 20 Watts coupled with the ability to withstand 500 hundred cycles of pulling and plugging. Accordingly, the exemplary thermal interface solutions disclosed herein may provide higher temperature gain, better mechanical performance, and/or cost efficiency/synergies as compared to convention thermal interface materials.

Table 2 below includes thermal performance measurements for two example thermal interface material assemblies (TIMA) including an antifriction layer along a polymer layer. For comparison purposes, Table 2 also includes thermal performance measurements for a thermal interface material assembly (TIMA) that did not include an antifriction layer. Table 2 also includes thermal performance materials for a test case (Blank) that did not include any thermal interface material assembly (TIMA) between the surfaces. Table 2 shows the synergistic effect that the two example thermal interface material assemblies have on thermal performance (e.g., improvement of at least 5° C. temperature reduction at about 20 Watts) and ability to withstand 500 hundred cycles of pulling and plugging.

For the thermal interface material assembly (TIMA) without an antifriction layer, the TIMA included a 38 micron thick thermally-conductive polyimide film (e.g., KAPTON 150MT+ polyimide film, etc.) and a pressure sensitive adhesive.

For the First Example thermal interface material assembly (TIMA) with an antifriction layer, the TIMA included a 3 micron thick antifriction coating (e.g., MOLYKOTE D-96 Anti-Friction Coating, etc.) on a 7 micron thick polyimide film (e.g., KAPTON 30EN polyimide film, etc.) that did not include filler. The TIMA also includes a pressure sensitive adhesive.

For the Second Example thermal interface material assembly (TIMA) with an antifriction layer, the TIMA included a 3 micron thick antifriction coating (e.g., MOLYKOTE D-96 Anti-Friction Coating, etc.) on a 38 micron thick thermally-conductive polyimide film (e.g., KAPTON 150MT+ polyimide film, etc.). The TIMA also includes a pressure sensitive adhesive.

In table 2 below, $\Delta T$ (Core-Rm) is the difference between test case core temperature and room temperature. $\Delta T$ (TIMA-Blank) is the thermal interface material assembly (TIMA) temperature gain against blank test.

TABLE 2

| Test Cases Average ° C. at 20 W | $\Delta T$ (Core – Rm) | Stdev | Repeat # | $\Delta T$ (TIMA – Blank) |
|---|---|---|---|---|
| Blank (without any TIMA) | 52.9 | 1.4 | 21 | 0 |
| TIMA (without Antifriction Layer) | 49.2 | 1.0 | 10 | -3.8 |
| First Example TIMA with Antifriction Layer | 47.6 | 0.6 | 6 | -5.4 |
| Second Example TIMA with Antifriction Layer | 47.7 | 0.4 | 5 | -5.3 |

Table 2 shows that TIM assembly without any antifriction layer between the surfaces only provided a temperature reduction of −3.8 degrees Celsius as compared to the test case without any TIM assembly. By comparison, Table 2 shows that the TIM assemblies with the antifriction layer provided a significantly higher temperature reduction of −5.4 degrees Celsius and −5.3 degrees Celsius as compared to the test case without any TIM assembly. And the TIM assemblies with the antifriction layer also provided a temperature reduction improvement of 1.5 and 1.6 degrees Celsius as compared to TIM assembly without any antifriction layer. Accordingly, the thermal interface material assemblies (e.g., 100 shown in FIG. 2, etc.) including antifriction layers may greatly improve performance, reliability, and stability.

Exemplary embodiments disclosed herein may provide or include one or more (but not necessarily any or all) of the following advantageous effects or features. By positioning (e.g., adhesively attaching, etc.) a thermal interface material assembly along or on a surface of an optical module (broadly, a second component), the thermal interface material assembly's antifriction layer faces the inner surface of a cavity of a housing (broadly, a first component). When the optical module is slidably inserted into or slidably pulled out via the opening of the cavity, the antifriction layer may therefore contact (e.g., frictionally contact, slidably contact, etc.) the inner surface of the cavity instead of having the surface of the optical module contact the inner surface of the cavity. Direct contact and direct friction between the optical module and the inner surface of the housing's cavity is thereby avoided. This also decreases wearing of the thermal interface material, which may otherwise decrease the heat transfer capability of the thermal interface material. When the optical module is inserted into the cavity of the housing, the antifriction layer may be along (e.g., in direct thermal contact with, etc.) the inner surface of the cavity, which may help reduce heat resistance along the interface and transfer heat generated by the optical module to the inner surface thereby providing a good thermal performance.

Accordingly, exemplary embodiments are disclosed of thermal interface solutions for sliding surfaces. In exemplary embodiments, a thermal interface material assembly includes a substrate having opposite first and second surfaces. An antifriction layer is along the first surface of the substrate. A thermal interface material is along the second surface of the substrate, such that the substrate is between the antifriction layer and the thermal interface material. The antifriction layer is configured to slide along in contact with a first surface of a first component when the thermal interface material assembly is along a second surface of a second component and when the first and second surfaces are slidably moved relative to each other.

In exemplary embodiments, the antifriction layer comprises polytetrafluoroethylene (PTFE), molybdenum disulfide (MoS2), graphite, polyethylene, polypropylene, aluminum oxide, boron nitride, calcium fluoride, tungsten carbide, and/or aluminum. In such exemplary embodiments, the antifriction layer may comprise a polytetrafluoroethylene (PTFE), molybdenum disulfide (MoS2), graphite, polyethylene, polypropylene, aluminum oxide, boron nitride, calcium fluoride, tungsten carbide, and/or aluminum based antifriction coating along the first surface of the substrate. The antifriction layer is configured to have a lower coefficient of friction than the substrate. For example, the antifriction layer may be configured to have a coefficient of friction less than 0.25.

In exemplary embodiments, the antifriction layer comprises polytetrafluoroethylene and/or molybdenum disulfide. For example, the antifriction layer may comprise a polytetrafluoroethylene and/or molybdenum disulfide based antifriction coating along the first surface of the substrate. The antifriction layer is configured to have a lower coefficient of friction than the substrate. For example, the antifriction layer may be configured to have a coefficient of friction less than 0.25.

In exemplary embodiments, the substrate comprises a polymer substrate or a metal substrate. For example, the substrate may comprise a dielectric polyimide substrate.

In exemplary embodiments, the substrate comprises a dielectric polyimide film. The antifriction layer comprises an antifriction coating along the first surface of the substrate. The antifriction coating comprises polytetrafluoroethylene and/or molybdenum disulfide. The antifriction layer has a coefficient of friction less than 0.25 and less than a coefficient of friction of the dielectric polyimide film. The thermal interface material comprises a thermal phase change material having a thermal conductivity of at least 3 Watts per meter per Kelvin. The thermal interface material assembly further comprises a pressure sensitive adhesive that adhesively attaches the thermal interface material assembly to the second surface of the second component.

In exemplary embodiments, the thermal interface material comprises a thermal phase change material having a thermal conductivity of at least 3 Watts per meter per Kelvin.

In exemplary embodiments, the thermal interface material assembly is adhesively attached to the second surface of the second component. A pressure sensitive adhesive may be used that adhesively attaches the thermal interface material assembly to the second surface of the second component. The pressure sensitive adhesive may comprise first and second layers of pressure sensitive adhesive along opposite first and second sides of a polymer film (e.g., polyethylene terephthalate film, etc.).

In exemplary embodiments, the thermal interface material may include edge portions defining an outer perimeter. The pressure sensitive adhesive may be disposed along the edge portions of the thermal interface material around the outer perimeter of the thermal interface material, such that the pressure sensitive adhesive is between and adhesively attaches the second surface of the substrate to the second surface of the second component. The pressure sensitive adhesive may provide or define reinforcement along the edge portions of the thermal interface material that are parallel and/or perpendicular to a direction in which the second surface of the second component is slidable relative to the first surface of the first component when the thermal interface material assembly is between the first and second surfaces of the respective first and second components. The pressure sensitive adhesive may provide or define reinforcement along the edge portions of the thermal interface material that helps to confine the thermal interface material within an area defined by the reinforcement and thereby inhibits migration of the thermal interface material.

In exemplary embodiments, the substrate defines a wear-resisting layer over the thermal interface material.

In exemplary embodiments, the thermal interface material is naturally tacky and/or self-adherent to the second surface of the second component.

In exemplary embodiments, the substrate is adhesively attached to the second surface of the second component, such that the substrate is disposed over the thermal interface material whereby the adhesive attachment of the substrate to the second surface of the second component retains positioning of the thermal interface material relative to the second surface of the second component.

In exemplary embodiments, the substrate comprises a polyimide film. For example, the substrate may comprise a polyimide film having a thermal conductivity within a range from 0.1 to 2 Watts per meter per Kelvin and a thickness within a range from 3 microns to 130 microns.

In exemplary embodiments, the thermal interface material is configured to have a thermal conductivity of at least 7.5 Watts per meter per Kelvin.

In exemplary embodiments, the second component comprises a heatsink including the second surface along which the thermal interface material assembly is disposed.

In exemplary embodiments, the thermal interface material is configured to provide a performance improvement of at least a 5° C. temperature reduction at 20 Watts and to withstand at least 500 hundred cycles of pulling and plugging.

In exemplary embodiments, the antifriction layer comprises lubricant applied along the first surface of the substrate. The lubricant preferably comprises a dry lubricant configured to slide along in contact with the first surface of the first component without leaving residue from the dry lubricant along the first surface of the first component.

In exemplary embodiments, a heatsink comprises the thermal interface material assembly.

In exemplary embodiments, the heatsink includes a protruding portion that protrudes outwardly from a surface of a first side of the heatsink and one or more heat dissipation fins protruding outwardly from a second side of the heatsink opposite the first side. The thermal interface material assembly is along the protruding portion of the heatsink.

In exemplary embodiments, a device comprises the heatsink and a housing adapted to slidably receive a connector.

The antifriction layer of the thermal interface material assembly slidably contacts a portion of the connector when the connector slidably received within or removed from the housing. The thermal interface material assembly is between the connector and the heatsink when the connector is slidably received within the housing whereby the thermal interface material assembly defines at least a portion of a thermally-conductive heat path between the connector and the heatsink.

In exemplary embodiments, the device is a small form-factor pluggable transceiver. The connector is a small form-factor pluggable cable connector. The housing is a small form-factor pluggable cage adapted to receive the small form-factor pluggable cable connector.

In exemplary embodiments, a device comprises a housing having a cavity including an opening and an inner surface within the cavity. The device further comprises a component having a surface corresponding to the inner surface within the cavity of the housing. The component is configured to be slidably insertable into and slidably removable from the cavity through the opening. A thermal interface material assembly is along the surface of the component. The thermal interface material assembly is configured such that the antifriction layer of the thermal interface material assembly faces the inner surface within the cavity of the housing when the component is within the cavity. The antifriction layer contacts the inner surface within the cavity of the housing when the component is slidably inserted into or removed from the cavity through the opening.

In exemplary embodiments, one or more heat dissipation fins protrudes outwardly from a wall of the housing.

In exemplary embodiments, the component comprises a connector. The housing comprises a cage including the cavity configured to receive the connector.

In exemplary embodiments, the device is a small form-factor pluggable transceiver. The component comprises a small form-factor pluggable cable connector. The housing is a small form-factor pluggable cage including the cavity configured to receive the small form-factor pluggable cable connector.

In exemplary embodiments, the device is a photoelectric conversion device. The component is an optical module including a surface corresponding to the inner surface within the cavity of the housing. The thermal interface material assembly is along the surface of the optical module.

Example embodiments are provided so that this disclosure will be thorough and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific numerical dimensions and values, specific materials, and/or specific shapes disclosed herein are example in nature and do not limit the scope of the present disclosure.

The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (the disclosure of a first value and a second value for a given parameter may be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping, or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "includes," "including," "has," "have," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected, or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer, or section. Terms such as "first," "second," and other numerical terms when used herein do not imply a sequence or order unless clearly indicated by the context. Thus, a first element, component, region, layer, or section could be termed a second element, component, region, layer, or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and may be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A thermal interface material assembly comprising:
a substrate having opposite first and second surfaces;
an antifriction layer along the first surface of the substrate; and
a thermal interface material along the second surface of the substrate, such that the substrate is between the antifriction layer and the thermal interface material;
wherein the antifriction layer is configured to have a lower coefficient of friction than the substrate;
wherein the thermal interface material has a higher thermal conductivity than each of the substrate and the antifriction layer;
wherein the antifriction layer comprises polytetrafluoroethylene, molybdenum disulfide, graphite, polyethylene, polypropylene, aluminum oxide, boron nitride, calcium fluoride, tungsten carbide, and/or aluminum;
wherein the substrate comprises a polyimide film having a thermal conductivity within a range from 0.1 to 2 Watts per meter per Kelvin and a thickness within a range from 3 microns to 50 microns;
wherein a pressure sensitive adhesive (PSA) structure is disposed along edge portions of the thermal interface material, the PSA structure including first and second PSA strips along opposed edges parallel to a direction of sliding, the PSA structure adhesively attaches the TIM assembly to a second surface of a second component and defines a channel that laterally confines the thermal interface material between the opposed edges, wherein the substrate overlies and spans the channel and the first and second PSA strips to define a wear-resisting layer over the thermal interface material;

whereby the antifriction layer is configured to slide along in contact with a first surface of a first component when the thermal interface material assembly is along the second surface of the second component such that the substrate and the antifriction layer along the first surface of the substrate intervenes between the first surface of the first component and the thermal interface material along the second surface of the substrate thereby preventing direct contact between the thermal interface material and the first surface of the first component when the first surface of the first component and the second surface of the second component are slidably moved relative to each other.

2. The thermal interface material assembly of claim 1, wherein the thermal interface material comprises a thermal phase change material.

3. The thermal interface material assembly of claim 1, wherein the antifriction layer is configured to have a coefficient of friction less than 0.25.

4. The thermal interface material assembly of claim 1, wherein the antifriction layer comprises polytetrafluoroethylene (PTFE) and/or molybdenum disulfide as a dry-lubricant coating having a thickness within a range from 1 micron to 30 microns and a coefficient of friction less than 0.25.

5. The thermal interface material assembly of claim 1, wherein the antifriction layer comprises a dry lubricant applied along the first surface of the substrate and configured to slide along in contact with the first surface of the first component without leaving visible residue from the dry lubricant along the first surface of the first component after at least 500 sliding insertion/removal cycles at a temperature of 75° C. or above.

6. The thermal interface material assembly of claim 1, wherein the antifriction layer comprises molybdenum disulfide.

7. The thermal interface material assembly of claim 1, wherein the antifriction layer comprises polytetrafluoroethylene.

8. The thermal interface material assembly of claim 1, wherein:

the antifriction layer comprises polytetrafluoroethylene and/or molybdenum disulfide; and the antifriction layer is configured to have a coefficient of friction less than 0.25.

9. The thermal interface material assembly of claim 1, wherein, when installed between a pluggable transceiver cage/housing and a connector plug received therein, the thermal interface material assembly provides a temperature reduction of at least 5° C. at 20 W relative to a configuration without the assembly and withstands at least 500 insertion/removal cycles without detachment or material transfer.

10. The thermal interface material assembly of claim 1, wherein;

the antifriction layer comprises polytetrafluoroethylene (PTFE) and/or molybdenum disulfide as a dry-lubricant coating having a thickness within a range from 1 micron to 30 microns and a coefficient of friction less than 0.25;

the antifriction layer is configured not to transfer visible residue to the first component after at least 500 sliding insertion/removal cycles at a temperature of 75° C. or above; and when installed between a pluggable transceiver cage/housing and a connector plug received therein, the thermal interface material assembly provides a temperature reduction of at least 5° C. at 20 W relative to a configuration without the assembly and withstands at least 500 insertion/removal cycles without detachment or material transfer.

11. The thermal interface material assembly of claim 1, wherein:

the antifriction layer comprises an antifriction coating along the first surface of the substrate, the antifriction coating comprising polytetrafluoroethylene and/or molybdenum disulfide, the antifriction layer having a coefficient of friction less than 0.25 and less than a coefficient of friction of the dielectric polyimide film; and the thermal interface material comprises a thermal phase change material having a thermal conductivity of at least 3 Watts per meter per Kelvin.

12. The thermal interface material assembly of claim 1, wherein the thermal interface material comprises a thermal phase change material having a thermal conductivity of at least 3 Watts per meter per Kelvin.

13. The thermal interface material assembly of claim 1, wherein the substrate comprises a non-metallized polyimide film with surface roughness Ra 0.02-0.07 microns, thermal interface material assembly is adhesively attached to the second surface of the second component.

14. The thermal interface material assembly of claim 1, wherein the first and second PSA strips are continuous and gap-free along the opposed edges parallel to the direction of sliding.

15. The thermal interface material assembly of claim 1, wherein the PSA structure further comprises additional PSA segments along edges perpendicular to the sliding direction, such that the PSA defines a perimeter frame bounding the thermal interface material.

16. The thermal interface material assembly of claim 1, wherein the pressure sensitive adhesive comprises first and second layers of pressure sensitive adhesive along opposite first and second sides of a polyethylene terephthalate film.

17. The thermal interface material assembly of claim 1, wherein:

the thermal interface material includes edge portions defining an outer perimeter; and the pressure sensitive adhesive is disposed along the edge portions of the thermal interface material around the outer perimeter of the thermal interface material, such that the pressure sensitive adhesive is between and adhesively attaches the second surface of the substrate to the second surface of the second component.

18. The thermal interface material of claim 17, wherein the pressure sensitive adhesive provides reinforcement along the edge portions of the thermal interface material that are parallel and/or perpendicular to a direction in which the second surface of the second component is slidable relative to the first surface of the first component when the thermal interface material assembly is between the first and second surfaces of the respective first and second components.

19. The assembly of claim 17, wherein the pressure sensitive adhesive provides reinforcement along the edge portions of the thermal interface material that helps to confine the thermal interface material within an area defined by the reinforcement and thereby inhibits migration of the thermal interface material.

20. The thermal interface material assembly of claim 1, wherein a central region between the first and second PSA is substantially free of PSA, thereby reducing migration of the thermal interface material during thermal cycling.

21. The thermal interface material assembly of claim 1, wherein the thermal interface material is naturally tacky and/or self-adherent to the second surface of the second component.

22. The thermal interface material assembly of claim 1, wherein the substrate is adhesively attached to the second surface of the second component, such that the substrate is disposed over the thermal interface material whereby the adhesive attachment of the substrate to the second surface of the second component retains positioning of the thermal interface material relative to the second surface of the second component.

23. The thermal interface material assembly of claim 1, wherein after 500 cycles of sliding insertion/removal at a temperature of 75° C. or above, the thermal interface material assembly exhibits no visible residue transfer from the antifriction layer and a temperature reduction of at least 5° C. at 20 W relative to a configuration without the assembly.

24. The thermal interface material assembly of claim 1, wherein the thermal interface material is configured to have a thermal conductivity of at least 7.5 Watts per meter per Kelvin.

25. The thermal interface material assembly of claim 1, wherein the second component comprises a heatsink including the second surface along which the thermal interface material assembly is disposed.

26. The thermal interface material assembly of claim 1, wherein the antifriction layer comprise a lubricant applied along the first surface of the substrate.

27. The thermal interface material assembly of claim 26, wherein the lubricant comprises a dry lubricant configured to slide along in contact with the first surface of the first component without leaving residue from the dry lubricant along the first surface of the first component.

28. A heatsink comprising the thermal interface material assembly of claim 1, wherein:
   the heatsink includes a protruding portion that protrudes outwardly from a surface of a first side of the heatsink and one or more heat dissipation fins protruding outwardly from a second side of the heatsink opposite the first side; and
   the thermal interface material assembly is along the protruding portion of the heatsink.

29. A device comprising the heatsink of claim 28 and a housing adapted to slidably receive a connector, wherein:
   the antifriction layer slidably contacts a portion of the connector when the connector slidably received within or removed from the housing; and
   the thermal interface material assembly is between the connector and the heatsink when the connector is slidably received within the housing whereby the thermal interface material assembly defines at least a portion of a thermally-conductive heat path between the connector and the heatsink.

30. The device of claim 29, wherein:
   the device is a small form-factor pluggable transceiver;
   the connector is a small form-factor pluggable cable connector; and
   the housing is a small form-factor pluggable cage adapted to receive the small form-factor pluggable cable connector.

31. A device comprising:
   a housing having a cavity including an opening and an inner surface within the cavity;
   a component having a surface corresponding to the inner surface within the cavity of the housing, the component configured to be slidably insertable into and slidably removable from the cavity through the opening; and
   the thermal interface material assembly of claim 1 along the surface of the component, the thermal interface material assembly configured such that the antifriction layer faces the inner surface within the cavity of the housing when the component is within the cavity, whereby the antifriction layer contacts the inner surface within the cavity of the housing when the component is slidably inserted into or removed from the cavity through the opening.

32. The device of claim 31, wherein:
   the device further comprises one or more heat dissipation fins protruding outwardly from a wall of the housing; and/or
   the component comprises a connector, and the housing comprises a cage including the cavity configured to receive the connector.

33. The device of claim 31, wherein:
   the device is a small form-factor pluggable transceiver;
   the component comprises a small form-factor pluggable cable connector; and
   the housing is a small form-factor pluggable cage including the cavity configured to receive the small form-factor pluggable cable connector.

34. The device of claim 31, wherein:
   the device is a photoelectric conversion device;
   the component is an optical module including a surface corresponding to the inner surface within the cavity of the housing; and
   the thermal interface material assembly is along the surface of the optical module.

* * * * *